(12) United States Patent
Koshiishi et al.

(10) Patent No.: US 11,348,760 B2
(45) Date of Patent: May 31, 2022

(54) PLASMA PROCESSING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Akira Koshiishi, Hwaseong-si (KR); Masato Horiguchi, Suwon-si (KR); Yongwoo Lee, Hwaseong-si (KR); Kyohyeok Kim, Seoul (KR); Dowon Kim, Jecheon-si (KR); Yunhwan Kim, Hwaseong-si (KR); Youngjin Noh, Ansan-si (KR); Jongwoo Sun, Hwaseong-si (KR); Taeil Cho, Daejeon (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/915,437

(22) Filed: Jun. 29, 2020

(65) Prior Publication Data
US 2021/0142985 A1 May 13, 2021

(30) Foreign Application Priority Data
Nov. 11, 2019 (KR) .......................... 10-2019-0143353

(51) Int. Cl.
*H01J 37/32* (2006.01)
*H01L 21/683* (2006.01)

(52) U.S. Cl.
CPC .... *H01J 37/32082* (2013.01); *H01J 37/3244* (2013.01); *H01J 37/32568* (2013.01); *H01L 21/6831* (2013.01)

(58) Field of Classification Search
CPC .......... H01J 37/32082; H01J 37/32091; H01J 37/32165; H01J 37/32366; H01J 37/32568
See application file for complete search history.

(56) References Cited

U.S. PATENT DOCUMENTS

| | | | |
|---|---|---|---|
| 5,744,049 A | 4/1998 | Hills et al. | |
| 6,346,915 B1* | 2/2002 | Okumura | H01J 37/32697 118/723 AN |
| 6,602,381 B1* | 8/2003 | Lenz | H01J 37/32623 156/345.1 |
| 7,230,202 B2 | 6/2007 | Hayashi et al. | |
| 9,852,889 B1 | 12/2017 | Kellogg et al. | |
| 2009/0126871 A1* | 5/2009 | Yamazawa | H01J 37/32165 156/345.29 |

(Continued)

FOREIGN PATENT DOCUMENTS

KR    10-1850193 B1    4/2018

*Primary Examiner* — Tung X Le
(74) *Attorney, Agent, or Firm* — Muir Patent Law, PLLC

(57) ABSTRACT

A plasma processing apparatus includes a chamber, a lower and upper electrodes vertically spaced apart from each other in the chamber, a RF transmitting part connected to the lower electrode and configured to supply RF power to the lower electrode, a ground plate spaced downwardly from the lower electrode, and an insulating member laterally surrounding a cavity formed between the lower electrode and the ground plate. The cavity is isolated from a region under the ground plate by the ground plate.

17 Claims, 10 Drawing Sheets

(56) References Cited

U.S. PATENT DOCUMENTS

| | | | |
|---|---|---|---|
| 2009/0242135 A1* | 10/2009 | Koshimizu | H01J 37/32541 |
| | | | 156/345.48 |
| 2010/0243609 A1 | 9/2010 | Yamazawa et al. | |
| 2012/0021538 A1* | 1/2012 | Lee | H01L 21/31116 |
| | | | 438/5 |
| 2012/0031560 A1* | 2/2012 | Koshimizu | H01J 37/32623 |
| | | | 156/345.33 |
| 2015/0380218 A1* | 12/2015 | Tan | H01J 37/32449 |
| | | | 156/345.33 |
| 2017/0236688 A1 | 8/2017 | Caron et al. | |
| 2017/0358475 A1 | 12/2017 | Kwon et al. | |

* cited by examiner

FIG. 4
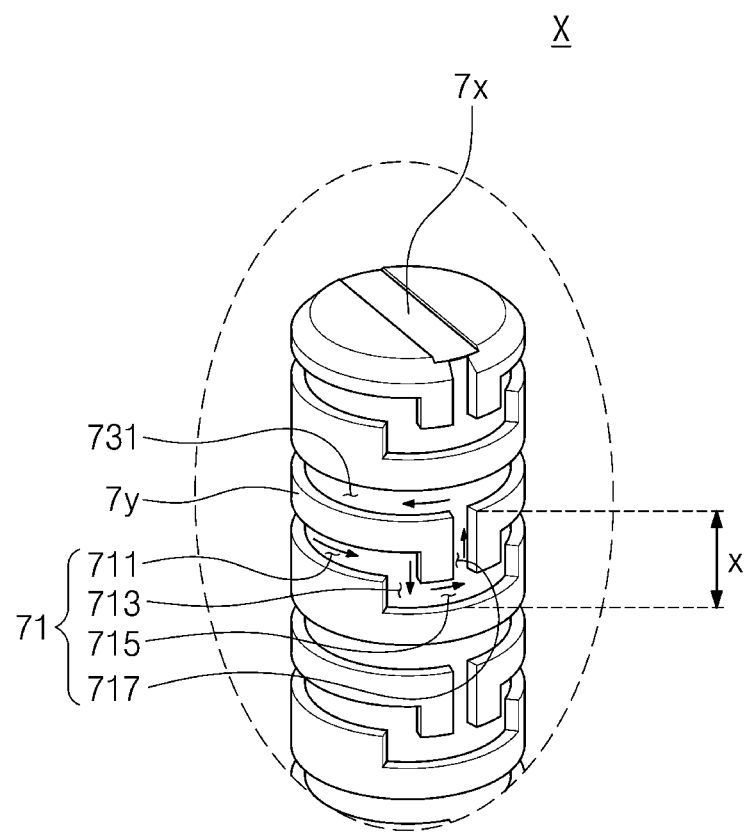
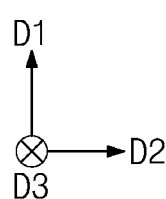

FIG. 5
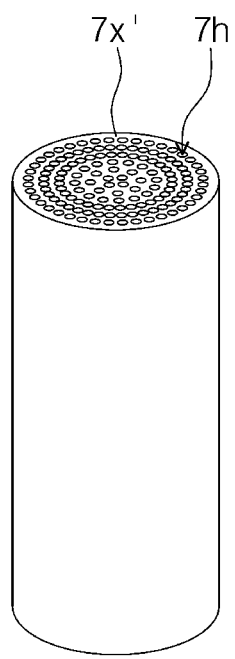
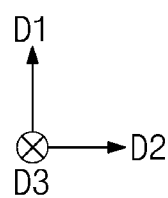

PLASMA PROCESSING APPARATUS AND METHOD OF MANUFACTURING SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2019-0143353, filed on Nov. 11, 2019, in the Korean Intellectual Property Office, the disclosure of which is hereby incorporated by reference in its entirety.

BACKGROUND

Embodiments of the inventive concepts relate to a plasma processing apparatus and, more particularly, to a plasma processing apparatus capable of enhancing a withstanding voltage.

Semiconductor manufacturing processes may include various processes. For example, the semiconductor manufacturing processes may include a deposition process or etching process performed on a semiconductor wafer. The deposition process or etching process of the semiconductor wafer may be performed in a process chamber. In the deposition process or etching process, plasma may be applied to the semiconductor wafer. The plasma may be formed by various methods. For example, the plasma may be formed by a capacitor couple plasma (CCP) method, an inductive coupled plasma (ICP) method, or a magnetically enhanced ME (MERIE) method. In the CCP or ICP method, to form the plasma, a gas may be injected into a process chamber and an electric field may be formed in a region in which the gas is located.

SUMMARY

Embodiments of the inventive concepts may provide a plasma processing apparatus capable of enhancing a withstanding voltage.

Embodiments of the inventive concepts may also provide a plasma processing apparatus capable of applying radio-frequency (RF) power having a high voltage.

Embodiments of the inventive concepts may further provide a plasma processing apparatus capable of forming a symmetric electric field in a chamber of the plasma processing apparatus.

Embodiments of the inventive concepts may further provide a plasma processing apparatus capable of improving dispersion of plasma in a chamber of the plasma processing apparatus.

In an aspect, a plasma processing apparatus may include a chamber, a lower and an upper electrodes vertically spaced apart from each other in the chamber, a RF transmitting part connected to the lower electrode and configured to supply RF power to the lower electrode, a ground plate spaced downwardly from the lower electrode, and an insulating member laterally surrounding a cavity formed between the lower electrode and the ground plate. The cavity may be isolated from a region under the ground plate by the ground plate.

In an aspect, a plasma processing apparatus may include a chamber, an upper electrode disposed at an upper portion of the chamber, a lower electrode disposed at a lower portion of the chamber, a RF transmitting part connected to the lower electrode and configured to supply RF power to the lower electrode, an electrostatic chuck provided on the lower electrode, and a gas supply part configured to supply a gas to a space on a top surface of the electrostatic chuck. The gas supply part may include a plurality of capillary tubes.

In an aspect, a plasma processing apparatus may include a process chamber, an upper electrode positioned at an upper portion of the process chamber, a lower electrode spaced apart from the upper electrode interposing a process space between the upper and lower electrodes, a RF transmitting part connected to the lower electrode and configured to supply RF power to the lower electrode, an electrostatic chuck provided on the lower electrode, and a gas supply part configured to supply a gas to a space on a top surface of the electrostatic chuck. The gas supply part may include a gas bypass.

BRIEF DESCRIPTION OF DRAWINGS

The inventive concepts will become more apparent in view of the attached drawings and accompanying detailed description.

FIG. 4 is an enlarged perspective view of a region 'X' of FIG. 3.

FIG. 5 is a perspective view illustrating a gas supply part according to some embodiments of the inventive concepts.

DETAILED DESCRIPTION OF THE EMBODIMENTS

Figure 1:
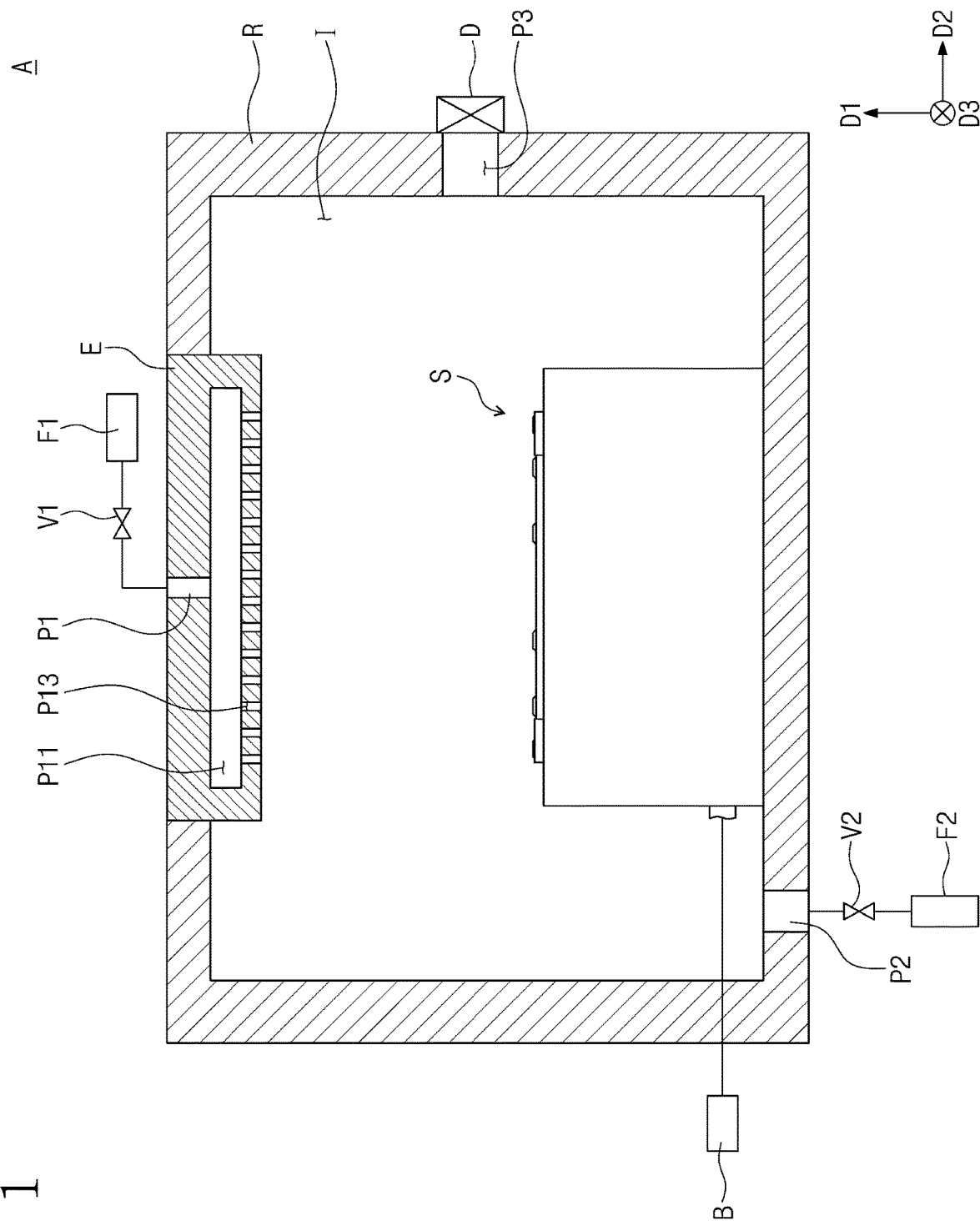
FIG. 1 is a cross-sectional view illustrating a plasma process chamber according to some embodiments of the inventive concepts.

Hereinafter, embodiments of the inventive concepts will be described in detail with reference to the accompanying drawings. The same reference numerals or the same reference designators may denote the same elements or components throughout the specification.

FIG. 1 is a cross-sectional view illustrating a plasma process chamber according to some embodiments of the inventive concepts.

Hereinafter, a reference designator 'D1' of FIG. 1 may be referred to as a first direction, and a reference designator 'D2' of FIG. 1 may be referred to as a second direction. The second direction is perpendicular to the first direction. A reference designator 'D3' perpendicular to the first and second directions D1 and D2 in FIG. 1 may be referred to as a third direction. For example, the first direction D1 may be a vertical direction, and the second and third directions D2 and D3 may be horizontal directions.

Referring to FIG. 1, a plasma process chamber R according to some embodiments of the inventive concepts may be provided. The plasma process chamber R may provide a process space I. The process space I may be selectively isolated from the outside. A deposition process or an etching process may be performed on a semiconductor wafer in the process space I of the plasma process chamber R. Plasma may be used in the deposition process or the etching process of the semiconductor wafer.

A plasma processing apparatus A may be provided with the process space I in the plasma process chamber R. A stage S may be located on a bottom of the plasma process chamber R. The semiconductor wafer may be placed on the stage S. The plasma processing apparatus A may include a lower electrode 1 (see FIG. 2). The plasma processing apparatus A may include a radio-frequency (RF) power source B. The plasma processing apparatus A will be described later in more detail with reference to FIGS. 2 to 10.

The plasma process chamber R may include an upper electrode part E, an entrance port P3, and an exhaust port P2. The upper electrode part E may be an upper electrode oppositely disposed to the lower electrode in the plasma process chamber R.

The upper electrode part E may be located over the stage S. The upper electrode part E may be spaced apart from the stage S in the first direction D1. The semiconductor wafer may be disposed between the upper electrode part E and the stage S. The deposition process or the etching process may be performed on the semiconductor wafer disposed between the upper electrode part E and the stage S. The upper electrode part E may include a conductive material. The upper electrode part E may include a metal. In some embodiments, the upper electrode part E may include aluminum (Al). The upper electrode part E and the lower electrode 1 (see FIG. 2) may form a pair of plate electrodes. In some embodiments, the upper electrode part E may be grounded. The upper electrode part E may have a gas inlet P1, a gas dispersion room P11, and a gas supply hole P13. The gas inlet P1 may be located at an upper side of the upper electrode part E. The gas inlet P1 may be connected to a gas inlet valve V1. The gas inlet valve V1 may be connected to an upper gas supply source F1. The upper gas supply source F1 may supply a gas into the plasma process chamber R. The gas may include a gas used in the deposition process or the etching process. The gas may include a gas capable of being formed into plasma. In some embodiments, the gas may include a gas which is formed into plasma when an electric field is applied thereto. When the gas inlet valve V1 is open, the gas inlet P1 may be connected to the upper gas supply source F1. When the gas inlet valve V1 is closed, the connection of the gas inlet P1 and the upper gas supply source F1 may be blocked. When the gas inlet valve V1 is open to connect the gas inlet P1 and the upper gas supply source F1, the gas may be supplied from the upper gas supply source F1 into the gas inlet P1. When the gas inlet valve V1 is closed to block the connection of the gas inlet P1 and the upper gas supply source F1, the gas supplied from the upper gas supply source F1 into the gas inlet P1 may be blocked. The gas inlet P1 may be connected to the gas dispersion room P11. The gas may flow into the gas dispersion room P11 through the gas inlet P1. The gas dispersion room P11 may extend in the second direction D2 and the third direction D3. The gas dispersion room P11 may disperse the gas, provided through the gas inlet P1, in the second direction D2 and the third direction D3. The gas dispersion room P11 may be connected to the gas supply hole P13. The gas supply hole P13 may extend in the first direction D1. The gas provided into the gas dispersion room P11 through the gas inlet P1 may flow into the gas supply hole P13. In some embodiments, the upper electrode E may include a plurality of gas supply holes P13. The plurality of gas supply holes P13 may be spaced apart from each other in the second direction D2 and/or the third direction D3. The plurality of gas supply holes P13 may be connected to the process space I. The gas may flow into the process space I through the plurality of gas supply holes P13.

The entrance port P3 may connect the process space I of the plasma process chamber R to the outside. In some embodiments, the entrance port P3 may be provided in a sidewall of the plasma process chamber R. The semiconductor wafer may be inserted into the process space I through the entrance port P3. In some embodiments, the semiconductor wafer may be inserted into the process space I through the entrance port P3 by a robot arm. The semiconductor wafer may be provided to the outside through the entrance port P3. In some embodiments, the semiconductor wafer may be provided to the outside through the entrance port P3 by the robot arm. A gate valve D may be connected to the entrance port P3. The gate valve D may open/close the entrance port P3. When the gate valve D is open, the process space I of the plasma process chamber R may be connected to the outside through the entrance port P3. When the gate valve D is closed, the process space I of the plasma process chamber R may be isolated from the outside. The process space I of the plasma process chamber R may be selectively isolated from the outside by the gate valve D. For example, the gate valve D may block the entrance port P3 to separate between the process space I and the outside of the plasma process chamber R.

The exhaust port P2 may connect the process space I of the plasma process chamber R to the outside. In some embodiments, the exhaust port P2 may be provided in a lower portion of the plasma process chamber R. A gas may be exhausted from the process space I to the outside through the exhaust port P2. The exhaust port P2 may be connected to an exhaust valve V2. The exhaust valve V2 may be connected to an exhaust unit F2. When the exhaust valve V2 is open, the exhaust port P2 may be connected to the exhaust unit F2. A gas existing in the process space I may be exhausted to the exhaust unit F2 through the exhaust port P2. When the exhaust valve V2 is closed, the connection of the exhaust port P2 and the exhaust unit F2 may be blocked. When the exhaust valve V2 is closed, the process space I of the plasma process chamber R may be isolated from the outside. The process space I of the plasma process chamber R may be selectively isolated from the outside by the exhaust valve V2. For example, the exhaust valve V2 may block the exhaust port P2 to separate between the process space I and the outside of the plasma process chamber R.

Figure 2:
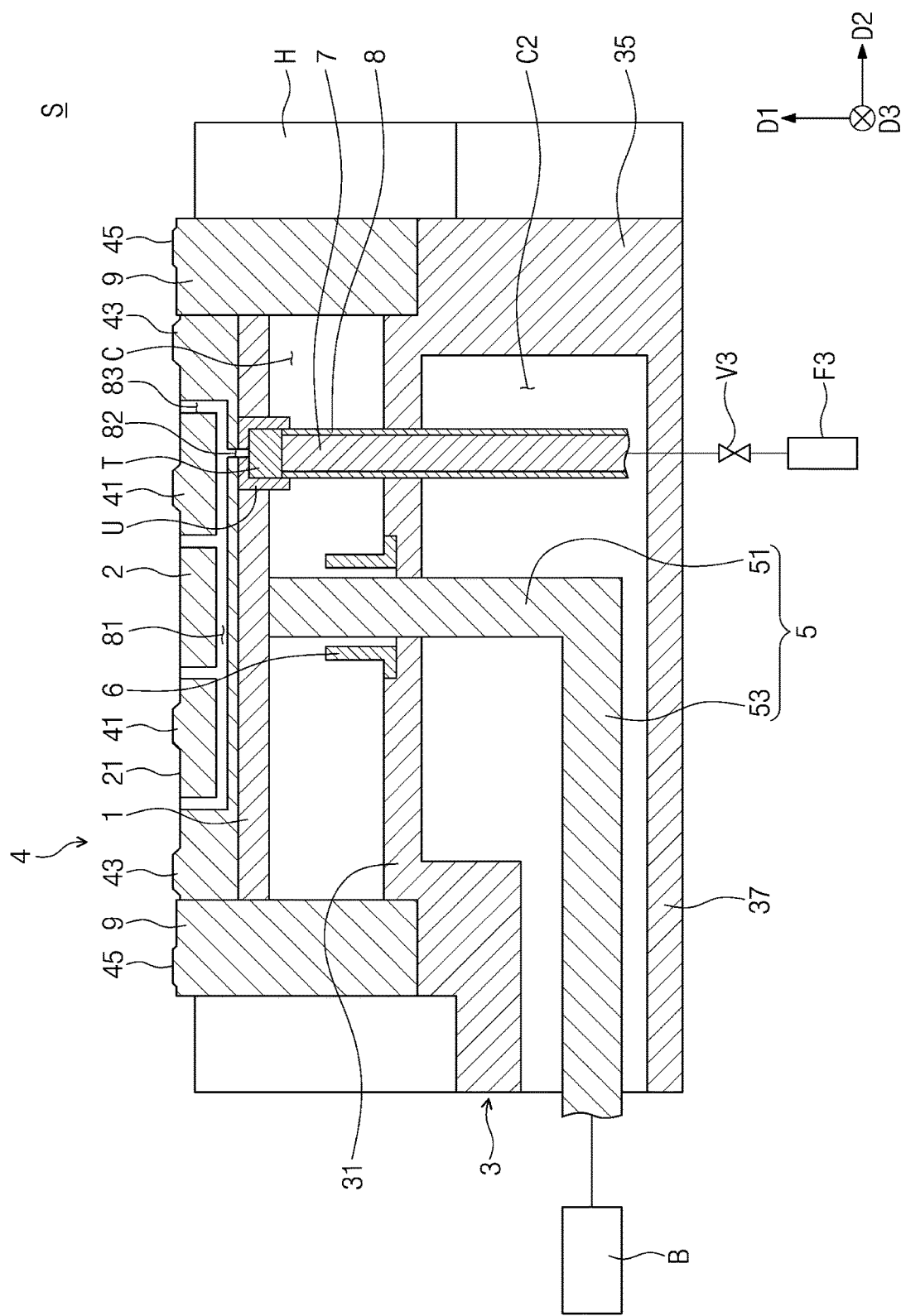
FIG. 2 is a cross-sectional view illustrating a stage of a plasma processing apparatus according to some embodiments of the inventive concepts.

FIG. 2 is a cross-sectional view illustrating a stage S of a plasma processing apparatus according to some embodiments of the inventive concepts.

Referring to FIG. 2, the plasma processing apparatus A may include the lower electrode 1, an electrostatic chuck 2, a ground part 3, a support member 4, a RF transmitting part 5, an extension electrode 6, a gas supply part 7, a gas supply part-protecting pipe 8, and an insulating member 9. In some embodiments, the plasma processing apparatus A may further include a housing H, a filter T, and a cap bushing U.

The lower electrode 1 may be disposed to face the upper electrode part E (see FIG. 1). In some embodiments, the lower electrode 1 may have a plate shape. The lower electrode 1 may have a plate shape extending in the second direction D2 and the third direction D3. For example, the lower electrode 1 may be an electrode plate. The lower electrode 1 may be located under the electrostatic chuck 2. The lower electrode 1 may be located on or above the ground part 3. The lower electrode 1 may be located between the electrostatic chuck 2 and the ground part 3. The lower electrode 1 may be spaced apart from the ground part 3. The lower electrode 1 may be spaced apart from the ground part 3 in the first direction D1. A cavity C may be provided between the lower electrode 1 and the ground part 3. In some embodiments, the lower electrode 1 may be disposed between portions of the insulating member 9. The lower electrode 1 may be connected to the RF transmitting part 5. The lower electrode 1 may receive radio-frequency (RF) power from the RF transmitting part 5. The lower electrode 1 may include a conductive material. The lower electrode 1 may include a metal. In some embodiments, the lower electrode 1 may include aluminum (Al). The upper electrode part E (see FIG. 1) and the lower electrode 1 may form a pair of plate electrodes. When the lower electrode 1 receives the RF power from the RF transmitting part 5, an electric field may be formed. In some embodiments, the electric field may be formed in the process space I (see FIG. 1). When the electric field is formed in the process space I, a gas provided in the process space I may be changed into plasma. In some embodiments, when the electric field is formed in the process space I, the plasma formed in the process space I may move in a certain/predetermined direction. For example, the electric field formed in the process space I may be formed by a combination of the RF power applied to the lower electrode 1 and an electric signal applied to the upper electrode part E. For example, the electric field may move the plasma toward the lower electrode. The deposition process or the etching process may be performed using the plasma. This will be described later in more detail.

The electrostatic chuck (ESC) 2 may be located on the lower electrode 1. The semiconductor wafer may be disposed or loaded on the electrostatic chuck 2. The semiconductor wafer may be disposed or loaded on a top surface 21 of the electrostatic chuck 2. The electrostatic chuck 2 may include a conductor and a non-conductor. The conductor may be disposed in a middle of the electrostatic chuck 2. The conductor disposed in the middle of the electrostatic chuck 2 may include a conductive layer. The non-conductor may surround the conductive layer disposed in the middle of the electrostatic chuck 2. The non-conductor surrounding the conductive layer may include ceramic and/or a polyimide film. The conductive layer may be electrically connected to an external electrode. In the present specification, it may be understood that when a component is referred to as being 'connected' to another component, it can be directly connected to the other component or intervening components may be present. The conductive layer electrically connected to the external electrode may receive a voltage from the external electrode. In some embodiments, the conductive layer may receive a high voltage from the external electrode. In some embodiments, the conductive layer may receive a DC voltage from the external electrode. The conductive layer receiving the voltage may fix the semiconductor wafer at a certain/predetermined position. The semiconductor wafer may be fixed at a certain/predetermined position by an electrostatic attraction force formed between the conductive layer and the semiconductor wafer. The semiconductor wafer may be horizontally fixed. For example, the semiconductor wafer may be attached on the electrostatic chuck 2 while maintaining the semiconductor wafer horizontally.

The deposition process or the etching process may be performed on the semiconductor wafer fixed by the attraction force of the conductive layer. The deposition process or etching process of the semiconductor wafer may be stably performed. In some embodiments, a gas flow path may further be provided in the electrostatic chuck 2. The gas flow path may include a gas diffusion flow path 81 and a gas distribution flow path 83. The gas diffusion flow path 81 may be connected to the gas supply part 7 through a gas connection flow path 82 and/or the filter T. For example, the gas connection flow path 82 may be a vertically extending portion of the gas flow path. A gas may be supplied from the gas supply part 7 into the gas diffusion flow path 81 and/or may be exhausted from the gas diffusion flow path 81 to the gas supply part 7. The gas diffusion flow path 81 may extend in the second direction D2 and/or the third direction D3. The gas supplied from the gas supply part 7 may be diffused along the gas diffusion flow path 81 in the second direction D2 and/or the third direction D3. The gas distribution flow path 83 may be connected to the gas diffusion flow path 81. The gas distribution flow path 83 may extend in the first direction D1. The gas distribution flow path 83 may be connected to a space on the top surface 21 of the electrostatic chuck 2. For example, the space on the top surface 21 of the electrostatic chuck 2 may be a space formed between the electrostatic chuck 2 and a wafer disposed on the electrostatic chuck 2. The gas supplied into the gas diffusion flow path 81 through the gas supply part 7 may flow into the space on the top surface 21 of the electrostatic chuck 2 through the gas distribution flow path 83. In some embodiments, the gas flow path may include a plurality of gas distribution flow path 83. The plurality of gas distribution flow paths 83 may be spaced apart from each other in the second direction D2 and/or the third direction D3. The gas may be widely distributed in the space on the top surface 21 of the electrostatic chuck 2 through the plurality of gas distribution flow paths 83 spaced apart from each other. This will be described later in more detail with reference to FIGS. 9 and 10.

The ground part 3 may be located under the lower electrode 1. The ground part 3 may include a conductive material. The ground part 3 may include a metal. In some embodiments, the ground part 3 may include aluminum (Al). The ground part 3 may be grounded. The ground part 3 may include a ground plate 31, a support plate 37, and a connection portion 35. The ground plate 31 may have a plate shape. The ground plate 31 may have a plate shape extending in the second direction D2 and the third direction D3. The ground plate 31 may be located under the lower electrode 1. The ground plate 31 may be spaced apart from the lower electrode 1. The ground plate 31 may be spaced apart from the lower electrode 1 in a direction opposite to the first direction D1. The cavity C may be provided between the ground plate 31 and the lower electrode 1. The cavity C may be defined by the lower electrode 1 and the ground plate 31. The support plate 37 may be located under the ground plate 31. The support plate 37 may support the other parts of the stage S. For example, the support plate 37 may be a bottom portion of the stage S. The connection portion 35 may connect the ground plate 31 and the support plate 37. The connection portion 35 may extend in the first direction D1. A lower cavity C2 may be provided between the ground plate 31, the support plate 37 and/or the connection portion 35. The lower cavity C2 may be defined by the ground plate 31, the support plate 37 and/or the connection portion 35. For example, the lower cavity C2 may be surrounded by the ground plate 31, the support plate 37 and the connection portion 35. A range of the electric field may be limited by the ground part 3. For example, the ground part 3 may limit and/or shield the electric filed formed by the electric signals applied to the lower electrode 1 and/or the upper electrode part E.

The support member 4 may be located on the electrostatic chuck 2 and/or the insulating member 9. The support member 4 may extend from the electrostatic chuck 2 and/or the insulating member 9 in the first direction D1. For example, the support member 4 may be a portion of the electrostatic chuck 2 and/or a portion of the insulating member 9 protruding from the top surface 21 of the electrostatic chuck 2 and/or from a top surface of the insulating member 9. The support member 4 may support the semiconductor wafer. The semiconductor wafer may be disposed or loaded on the support member 4. In some embodiments, the support member 4 and the electrostatic chuck 2 may be formed in a single unitary body. However, embodiments of the inventive concepts are not limited thereto. In some embodiments, the plasma processing apparatus A may include a plurality of support members 4, e.g., including first to third support members 41, 43 and 45. For example, a first support member 41 may be located on the electrostatic chuck 2. The first support member 41 may have a circular ring shape on the electrostatic chuck 2. A second support member 43 may be provided outside the first support member 41. The second support member 43 may be substantially concentric with the first support member 41. In some embodiments, a third support member 45 may be provided outside the second support member 43. The third support member 45 may be substantially concentric with the second support member 43. For example, the second support member 43 may be a ring shape protruding from the top surface 21 of the electrostatic chuck 2, and the third support member 45 may be a ring shape protruding from the top surface of the insulating member 9. When the semiconductor wafer is placed or loaded on the support member 4, a space surrounded by the semiconductor wafer, the support member 4, the electrostatic chuck 2 and the insulating member 9 may be sealed from the outside. Thus, a gas existing in the space between the semiconductor wafer and the electrostatic chuck 2 may not leak to the outside.

Terms such as "concentric," "rectangular," "same," "equal," "planar," or "coplanar", as used herein when referring to position, orientation, layout, location, shapes, sizes, amounts, or other measures do not necessarily mean an exactly identical position, orientation, layout, location, shape, size, amount, or other measure, but are intended to encompass nearly identical position, orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially concentric," "substantially the same," "substantially equal," or "substantially planar," may be exactly concentric, the same, equal, or planar, or may be concentric, the same, equal, or planar within acceptable variations that may occur, for example, due to manufacturing processes.

Figure 6:
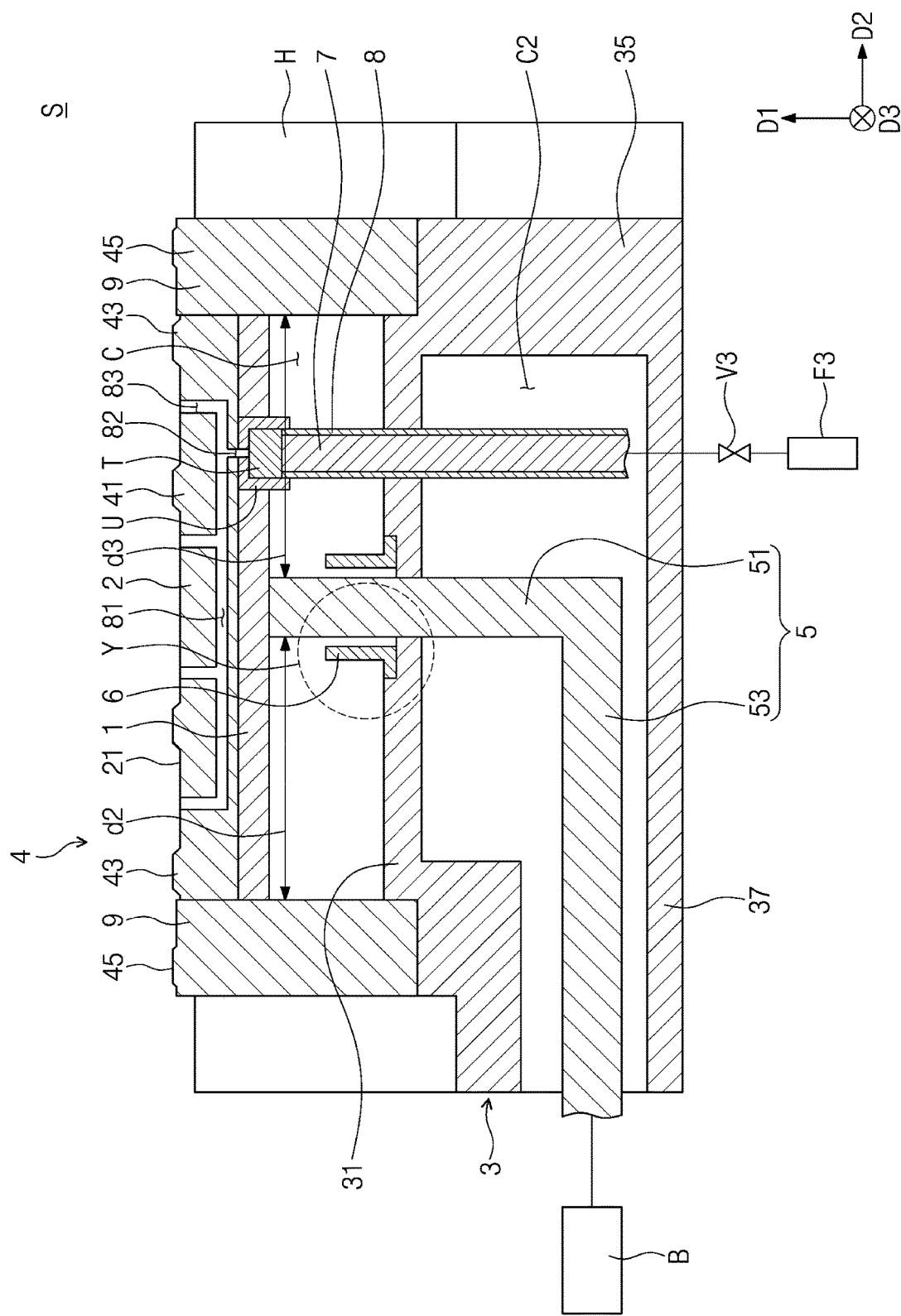
FIG. 6 is a cross-sectional view illustrating a stage of a plasma processing apparatus according to some embodiments of the inventive concepts.

The RF transmitting part 5 may be electrically connected to the lower electrode 1. The RF transmitting part 5 may be connected to a bottom of the lower electrode 1. The RF transmitting part 5 may be connected to a center of the bottom of the lower electrode 1. The RF transmitting part 5 may be electrically connected to a RF power source B. The RF transmitting part 5 may electrically connect the lower electrode 1 and the RF power source B. The RF transmitting part 5 may receive an AC voltage from the RF power source B. The RF transmitting part 5 may receive RF power from the RF power source B. The RF transmitting part 5 may transmit the RF power to the lower electrode 1. The RF transmitting part 5 may include a conductive material. The RF transmitting part 5 may include a metal. In some embodiments, the RF transmitting part 5 may include copper (Cu) and/or silver (Ag). For example, the RF transmitting part 5 may include copper (Cu) plated with silver (Ag). The RF transmitting part 5 may include a first transmitting member 51 and a second transmitting member 53. The first transmitting member 51 may have a rod shape. The first transmitting member 51 may be connected to the lower electrode 1. The first transmitting member 51 may be connected to the second transmitting member 53. The first transmitting member 51 may extend in the first direction D1. The first transmitting member 51 may penetrate the ground plate 31 and/or the cavity C. The first transmitting member 51 may penetrate a center of the ground plate 31. The first transmitting member 51 may penetrate a center of the cavity C. Referring to FIG. 6, the cavity C may be symmetrical with respect to the first transmitting member 51. A left distance d2 from the first transmitting member 51 to a left portion of the insulating member 9 may be substantially equal or similar to a right distance d3 from the first transmitting member 51 to a right portion of the insulating member 9. For example, the insulating member 9 may have a cylindrical shape using the first transmitting member 51 as an axis of the cylindrical shape. The first transmitting member 51 may be connected to the center of the lower electrode 1. The second transmitting member 53 may have a rod shape. The second transmitting member 53 may extend in the second direction D2. A portion of the second transmitting member 53 may be located in the lower cavity C2. The second transmitting member 53 may be connected to the first transmitting member 51. The second transmitting member 53 and the first transmitting member 51 may be connected to each other in the lower cavity C2. The second transmitting member 53 may be connected to the RF power source B. The second transmitting member 53 may connect the first transmitting member 51 and the RF power source B. The RF power may be applied to the lower electrode 1 by the RF transmitting part 5. This will be described later in more detail.

The extension electrode 6 may be located in the cavity C. The extension electrode 6 may include a conductive material. In some embodiments, the extension electrode 6 may include aluminum (Al). The extension electrode 6 may surround a portion of the RF transmitting part 5. The extension electrode 6 may surround a portion of the first transmitting member 51. A portion of the extension electrode 6 may extend in the first direction D1. The extension electrode 6 will be described later in more detail with reference to FIG. 7.

The gas supply part 7 may extend in the first direction D1. The gas supply part 7 may be connected to the lower electrode 1. The gas supply part 7 may supply a gas onto the top surface 21 of the electrostatic chuck 2 through the lower electrode 1 and the electrostatic chuck 2. The gas supply part 7 may supply a heat transfer gas. The heat transfer gas may include a gas having excellent thermal conductivity. In some embodiments, the heat transfer gas may include a helium (He) gas. To supply the heat transfer gas onto the top surface 21 of the electrostatic chuck 2, a flow path connected to the gas supply part 7 may be provided in the lower electrode 1 and the electrostatic chuck 2. The gas supply part 7 may be connected to the space on the electrostatic chuck 2. The gas supply part 7 may pass through the ground plate 31. In some embodiments, the gas supply part 7 may penetrate the ground plate 31. In some embodiments, the gas supply part 7 may be coupled to a hole formed in the ground plate 31. The gas supply part 7 may pass through the cavity C. The gas supply part 7 may pass through the lower cavity C2. The gas supply part 7 may be connected to a gas valve V3. The gas valve V3 may be connected to a gas supply source F3. When the gas valve V3 is open, the gas supply part 7 may be connected to the gas supply source F3. When the gas valve V3 is closed, the connection between the gas supply part 7 and the gas supply source F3 may be blocked. When the gas valve V3 is open, a gas may be supplied from the gas supply source F3 into the gas supply part 7. The gas supplied in the gas supply part 7 may be supplied onto the top surface 21 of the electrostatic chuck 2. When the gas valve V3 is open, the gas may escape from the gas supply part 7 to the gas supply source F3. The gas supply part 7 will be described later in more detail with reference to FIGS. 3 to 5.

The gas supply part-protecting pipe 8 may extend in the first direction D1. The gas supply part-protecting pipe 8 may surround the gas supply part 7. In some embodiments, a gas flow path may be provided between the gas supply part-protecting pipe 8 and the gas supply part 7. In some embodiments, the gas supply part-protecting pipe 8 may penetrate the ground plate 31. The gas supply part-protecting pipe 8 may pass through the cavity C. The gas supply part-protecting pipe 8 may pass through the lower cavity C2. The gas supply part-protecting pipe 8 may protect the gas supply part 7, e.g., from mechanical and chemical damages by surrounding the gas supply part 7.

The insulating member 9 may include an insulating material. In some embodiments, the insulating member 9 may include ceramic. The insulating member 9 may surround the cavity C. The insulating member 9 may laterally surround the cavity C. In some embodiments, the insulating member 9 may have a cylindrical shape. For example, the insulating member 9 may have a cylindrical shape using the first transmitting member 51 as an axis of the cylindrical shape. For example, distances from the first transmitting member 51 to the insulating member 9 in the second direction D2 and/or in the third direction D3 may be constant along the first direction D1. In addition, the left distance d2 (see FIG. 6) from the first transmitting member 51 to the insulating member 9 may be substantially equal to the right distance d3 (see FIG. 6) from the first transmitting member 51 to the insulating member 9. A portion or the whole of an inner space of the insulating member 9 having the cylindrical shape may correspond to the cavity C. The cavity C may be surrounded by the insulating member 9, the lower electrode 1, and the ground plate 31. For example, the cavity C may be an enclosed volume of space formed by the insulating member 9, the lower electrode 1, and the ground plate 31.

In the plasma processing apparatus A according to the embodiments of the inventive concepts, the cavity may be formed symmetrically. The cavity corresponding to a region in which an electric field is formed may be formed symmetrically. Thus, the electric field may be formed symmetrically. Plasma may be uniformly and symmetrically distributed by the electric field formed symmetrically. Thus, dispersion of the plasma may be improved. For example, the cavity C and its symmetrical shape may be beneficial for the plasma formed in the process space I to be uniform and/or symmetrical. The deposition process or etching process using the plasma may be uniformly and symmetrically performed. As a result, a yield of the deposition process or etching process performed on a wafer may be improved.

The cavity C surrounded by the insulating member 9, the lower electrode 1 and the ground plate 31 may be isolated from the outside. In some embodiments, it may be understood that when the cavity C is isolated from the outside, the cavity C may be electrically isolated from the outside. In certain embodiments, the electric field formed in the cavity C may not affect a region under the ground plate 31. Various materials may exist in the region under the ground plate 31. In some embodiments, the region under the ground plate 31 may be the lower cavity C2 filled with a gas or air. Alternatively, a motor or another solid may be located in the region under the ground plate 31. When the region under the ground plate 31 is the lower cavity C2, the cavity C may be electrically isolated from the lower cavity C2. Thus, even though the electric field is formed in the cavity C, an electric field may not be formed in the lower cavity C2. For example, the lower cavity C2 may be enclosed by a conductive material, e.g., by the ground part 3. In some embodiments, it may be understood that when the cavity C is isolated from the outside, the cavity C may be spatially separated from the outside to prevent inflow and outflow of a fluid. For example, the cavity C may not be connected to the lower cavity C2. For example, the cavity C and/or the lower cavity C2 may be enclosed by a mechanical structure, e.g., with a solid structure. In addition, the cavity C may not be connected to the process space I (see FIG. 1). The cavity C surrounded by the insulating member 9 may be symmetrical with respect to the first transmitting member 51. For example, the insulating member 9 may have a cylindrical shape having the axis of the cylindrical shape overlapping with a center of the first transmitting member 51. The widths of the cavity in the second and third directions D2 and D3 may be substantially the same as the widths of the electrostatic chuck 21 in the second and third directions D2 and D3 respectively.

In the plasma processing apparatus A according to the embodiments of the inventive concepts, the cavity corresponding to the region in which the electric field is formed may be isolated from the outside. The cavity may be isolated from the outside, and the region in which the electric field is formed may be isolated from the lower cavity. Thus, the region in which the electric field is formed may be limited. An electric field may not be formed in the lower cavity of the plasma processing apparatus A. Various components may be located in the lower cavity. A component including a conductive material may be located in the lower cavity. In some embodiments, a motor may be located in the lower cavity. For example, various apparatuses may be used to drive a lifter pin for lifting or lowering a wafer. In some embodiments, a motor as well as an air cylinder may be used to drive the lifter pin. Other various components may also be located in the lower cavity.

In the plasma processing apparatus A according to the embodiments of the inventive concepts, the region in which the electric field is formed may be isolated from the outside, and the number of components located in the cavity corresponding to the region in which the electric field is formed may be reduced. In addition, a conductive material may not exist in the cavity corresponding to the region in which the electric field is formed. Thus, it may be easy to realize a symmetric structure in the region in which the electric field is formed. For example, it may be easy to realize the symmetric structure of the cavity corresponding to the region in which the electric field is formed. Thus, symmetric distribution of the electric field may be realized. For example, symmetric distribution of the electric field may be provided in the process space I of the plasma process chamber R. When the symmetric distribution of the electric field is realized, symmetric distribution of the plasma may be realized. Thus, dispersion of the plasma in the deposition process or etching process may be improved.

In some embodiments, a gas may fill the cavity C. The gas filling the cavity C may include air. A pressure of the gas filling the cavity C may be substantially similar to the atmospheric pressure. A dielectric constant of the air may be lower than a dielectric constant of ceramic. In certain embodiments, the inside of the cavity C may be maintained in a vacuum. The insulating member 9 may surround a side surface of the lower electrode 1. In some embodiments, the insulating member 9 may surround a side surface of the electrostatic chuck 2.

In the plasma processing apparatus A according to the embodiments of the inventive concepts, the cavity filled with the air having a low dielectric constant may be provided, e.g., under the lower electrode. A withstanding voltage may be enhanced by the cavity. Accordingly, electric discharge by the RF power may be prevented. Thus, the RF power having a high voltage may be used in the plasma processing apparatus A. Therefore, a strong electric field may be formed within the plasma process chamber R by the high RF power. The strong electric field may be beneficial for performing a deep etching of a semiconductor wafer.

The housing H may form the exterior of the stage S. In some embodiments, the housing H may surround the insulating member 9. In some embodiments, the housing H may surround the ground part 3.

The filter T may be disposed on the gas supply part 7 and/or the gas supply part-protecting pipe 8. In some embodiments, a portion or the whole of the filter T may be disposed in the lower electrode 1. The filter T may have a porous structure. The filter T may include ceramic. The filter T may prevent plasma from coming in contact with the gas supply part 7 and/or the gas supply part-protecting pipe 8.

The cap bushing U may be disposed on the gas supply part 7 and/or the gas supply part-protecting pipe 8. The cap bushing U may surround a portion or the whole of the filter T. In some embodiments, the cap bushing U may surround a portion of the gas supply part 7 and/or the gas supply part-protecting pipe 8. An upper portion of the cap bushing U may provide the gas connection flow path 82. The gas connection flow path 82 of which a portion is provided in the cap bushing U may extend into the electrostatic chuck 2 so as to be connected to the gas diffusion flow path 81. The cap bushing U may include an insulating material. In some embodiments, the cap bushing U may include aluminum oxide ($Al_2O_3$). The cap bushing U may prevent a gas in the filter T or plasma from coming in contact with the lower electrode 1.

Figure 3:
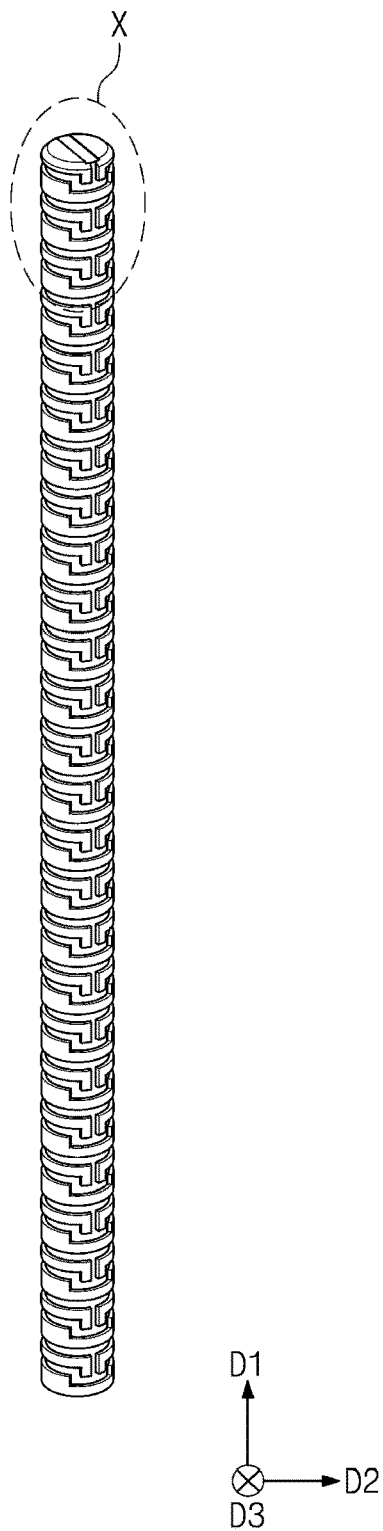
FIG. 3 is a perspective view illustrating a gas supply part according to some embodiments of the inventive concepts.

FIG. 3 is a perspective view illustrating a gas supply part according to some embodiments of the inventive concepts, and FIG. 4 is an enlarged perspective view of a region 'X' of FIG. 3.

Referring to FIG. 3, a gas supply part 7a may be provided in a plasma processing apparatus A of an embodiment of the present disclosure. The gas supply part 7a of FIG. 3 may be an embodiment of the gas supply part 7 of FIG. 2. The gas supply part 7a may extend in the first direction D1.

Referring to FIG. 4, the gas supply part 7a may include plastic. A gas bypass may be provided by the gas supply part 7a. The gas bypass may include a plurality of flow paths extending in different directions. The extending directions of the plurality of flow paths may form a certain angle (e.g., right angle) with each other. A gas may flow in the gas bypass. The gas may pass through the plurality of flow paths having the different extending directions. A flow rate of the gas flowing in the gas bypass may not increase above a certain/predetermined level. For example, the flow rate of the gas flowing through the gas bypass may be controlled by the structure of the gas bypass and by controlling the pressure of the gas. For example, the structure of the gas bypass may be helpful for controlling the flow rate of the gas.

In some embodiments, the gas supply part 7a may include engineering plastic. The gas supply part 7a may include a body 7x and a flow path-forming part 7y. The body 7x may extend in the first direction D1. In some embodiments, the body 7x may have a cylindrical shape. However, embodiments of the inventive concepts are not limited thereto. The flow path-forming part 7y may be located on an outer surface of the body 7x. The gas supply part 7a may include a plurality of flow path-forming parts 7y. The plurality of flow path-forming parts 7y may be spaced apart from each other. In some embodiments, the gas bypass may be provided between the plurality of flow path-forming parts 7y. In some embodiments, the gas bypass 71 may be formed among the body 7x, the flow path-forming parts 7y and the gas supply part-protecting pipe 8 (see FIG. 2). For example, the gas bypass 71 may be surrounded by the body 7x, the flow path-forming parts 7y and the gas supply part-protecting pipe 8. For example, the gas bypass 71 may be formed between the flow path-forming parts 7y. The gas bypass 71 may include a first flow path 711, a second flow path 713, a third flow path 715, and a fourth flow path 717. In some embodiments, the first flow path 711 may substantially laterally extend along the outer surface of the body 7x. When the body 7x has a cylindrical shape, an extending direction of the first flow path 711 may be horizontally curved along the outer surface of the body 7x. The second flow path 713 may be connected to the first flow path 711. The second flow path 713 may substantially vertically extend along the outer surface of the body 7x. The second flow path 713 may extend in the first direction D1. The extending direction of the first flow path 711 may form a certain angle (e.g., right angle) with the extending direction of the second flow path 713. In some embodiments, the extending direction of the first flow path 711 may be substantially perpendicular to the extending direction of the second flow path 713. The third flow path 715 may extend substantially laterally. The third flow path 715 may be connected to the second flow path 713. The fourth flow path 717 may extend substantially vertically. The fourth flow path 717 may be connected to the third flow path 715. A length of the fourth flow path 717 may be greater than a length of the second flow path 713. A fifth flow path 731 may further be provided between the flow path-forming parts 7y. The fifth flow path 731 may extend substantially laterally. The fifth flow path 731 may be connected to the fourth flow path 717. The gas may flow along the gas bypass 71. The gas may flow in the first to fifth flow paths 711, 713, 715, 717 and 731. The gas may flow sequentially from the first flow path 711 to the fifth flow path 731. The gas passing horizontally through the first flow path 711 may flow downward along the second flow path 713. The gas passing vertically through the second flow path 713 may flow horizontally along the third flow path 715. The gas passing horizontally through the third flow path 715 may flow upward along the fourth flow path 717. The gas passing through the fourth flow path 717 may flow horizontally along the fifth flow path 731. A flow rate (or a movement speed) of the gas passing through the gas bypass 71 may be affected by the flow paths extending in different directions. A flow direction of the gas may be changed when the gas flows from one flow path to another flow path. The flow rate of the gas may be reduced when the gas flows from one flow path to another flow path. The flow rate of the gas may not increase above a certain/predetermined level. A length of a flow path extending in one direction may be limited to a predetermined length. A length X of the fourth flow path 717 extending in the first direction D1 may be equal to or less than a certain/predetermined value. In some embodiments, the length X of the fourth flow path 717 may be 5 mm or less. For example, the length X of the fourth flow path 717 may range from 4 mm to 5 mm. A length of another flow path extending in the first direction D1 (e.g. the second flow path 713) may also be 5 mm or less. However, embodiments of the inventive concepts are not limited thereto. For example, the length of the flow path may be different form the above mentioned values. The flow rate of the gas in the first direction D1 may limited to a certain/predetermined level. In some embodiments, the gas may include the heat transfer gas. This will be described later in more detail with reference to FIGS. 9 and 10.

FIG. 5 is a perspective view illustrating a gas supply part according to some embodiments of the inventive concepts.

Referring to FIG. 5, a gas supply part 7b may be provided in a plasma processing apparatus A according to an embodiment of the present disclosure. The gas supply part 7b of FIG. 5 may be an embodiment of the gas supply part 7 of FIG. 2. The gas supply part 7b may include a body 7x'. The body 7x' of the gas supply part 7b may extend in the first direction D1. The body 7x' of the gas supply part 7b may include ceramic. In some embodiments, the body 7x' of the gas supply part 7b may include aluminum oxide ($Al_2O_3$). The gas supply part 7b may include a capillary tube 7h. The capillary tube 7h may be provided in the body 7x' of the gas supply part 7b. The capillary tube 7h may extend in the first direction D1. In some embodiments, a diameter of the capillary tube 7h may range from 50 μm to 100 μm. A gas may flow in the capillary tube 7h. Particles of the gas flowing in the capillary tube 7h may collide with a wall of the capillary tube 7h. As the diameter of the capillary tube 7h decreases, the particles of the gas flowing in the capillary tube 7h may more often collide with the wall of the capillary tube 7h. A flow rate of the gas having the particles often colliding with the wall of the capillary tube 7h may not increase above a certain level. For example, the flow rate of the gas may be controlled by the sizes of diameter of the capillary tube 7h. In some embodiments, the gas supply part 7b may include a plurality of capillary tubes 7h. The plurality of capillary tubes 7h may be spaced apart from each other in the second direction D2 and/or the third direction D3.

In the plasma processing apparatus A according to the embodiments of the inventive concepts, the flow rate (or movement speed) of the heat transfer gas may be controlled to be a certain/predetermined level. For example, the flow rate of the heat transfer gas may be reduced by the capillary tubes and/or the flow paths. Accordingly, energy of the heat transfer gas may be reduced. Thus, ionization by a high flow rate of the heat transfer gas may be prevented. Therefore, electric discharge of the plasma processing apparatus A may be prevented by the prevention of the ionization of the heat transfer gas. A withstanding voltage characteristic may be improved by the prevention of the electric discharge of the plasma processing apparatus A. Therefore, electric discharge by high RF power may be prevented/improved. Thus, the high RF power may be applied to the plasma process performed in the plasma processing apparatus A.

Figure 7:
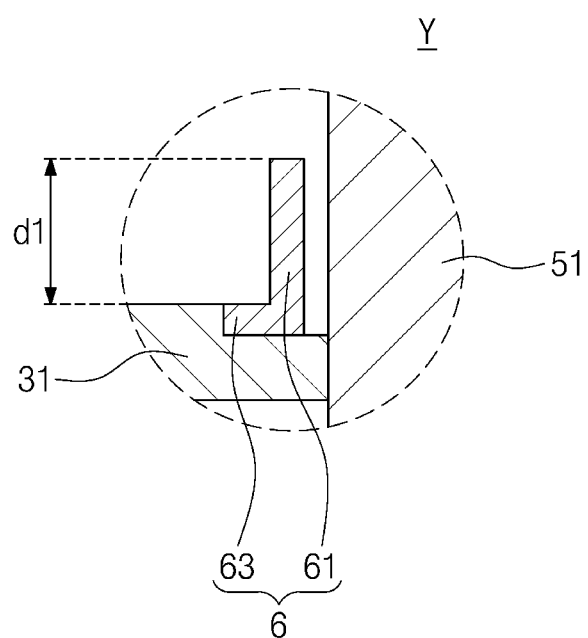
FIG. 7 is an enlarged cross-sectional view of a region 'Y' of FIG. 6.

FIG. 6 is a cross-sectional view illustrating a stage S of a plasma processing apparatus A according to some embodiments of the inventive concepts, and FIG. 7 is an enlarged cross-sectional view of a region 'Y' of FIG. 6.

Referring to FIGS. 6 and 7, the extension electrode 6 may be provided in the plasma processing apparatus A. The extension electrode 6 may surround a portion of the RF transmitting part 5. In some embodiments, the extension electrode 6 may surround a portion of the first transmitting member 51. The extension electrode 6 may be coupled to the ground plate 31. The extension electrode 6 may be located on the ground plate 31. The extension electrode 6 may include an electrode portion 61 and a support portion 63. The electrode portion 61 may extend in the first direction D1. The electrode portion 61 may surround a portion of the first transmitting member 51. In some embodiments, a length/height d1 of the electrode portion 61 may range from 40 mm to 60 mm. In some embodiments, the length d1 of the electrode portion 61 may be 50 mm. The support portion 63 may be coupled to the ground plate 31. For example, the support portion 63 may be attached on an upper surface of the ground plate 31. In some embodiments, the support portion 63 may be coupled to the ground plate 31 by a bolt. The support portion 63 may support the electrode portion 61. The support portion 63 may couple the electrode portion 61 to the ground plate 31.

In the plasma processing apparatus A according to the embodiments of the inventive concepts, the extension electrode 6 may be provided. Impedance of the plasma processing apparatus A may be optimized by the extension electrode 6. Thus, transmitting characteristics of the RF transmitting part may be optimized. A transmitting efficiency of the RF power may be improved by the extension electrode 6. An etch rate of a semiconductor wafer and dispersion of plasma may be improved, e.g., by the improved transmitting efficiency of the RF power.

Figure 8:
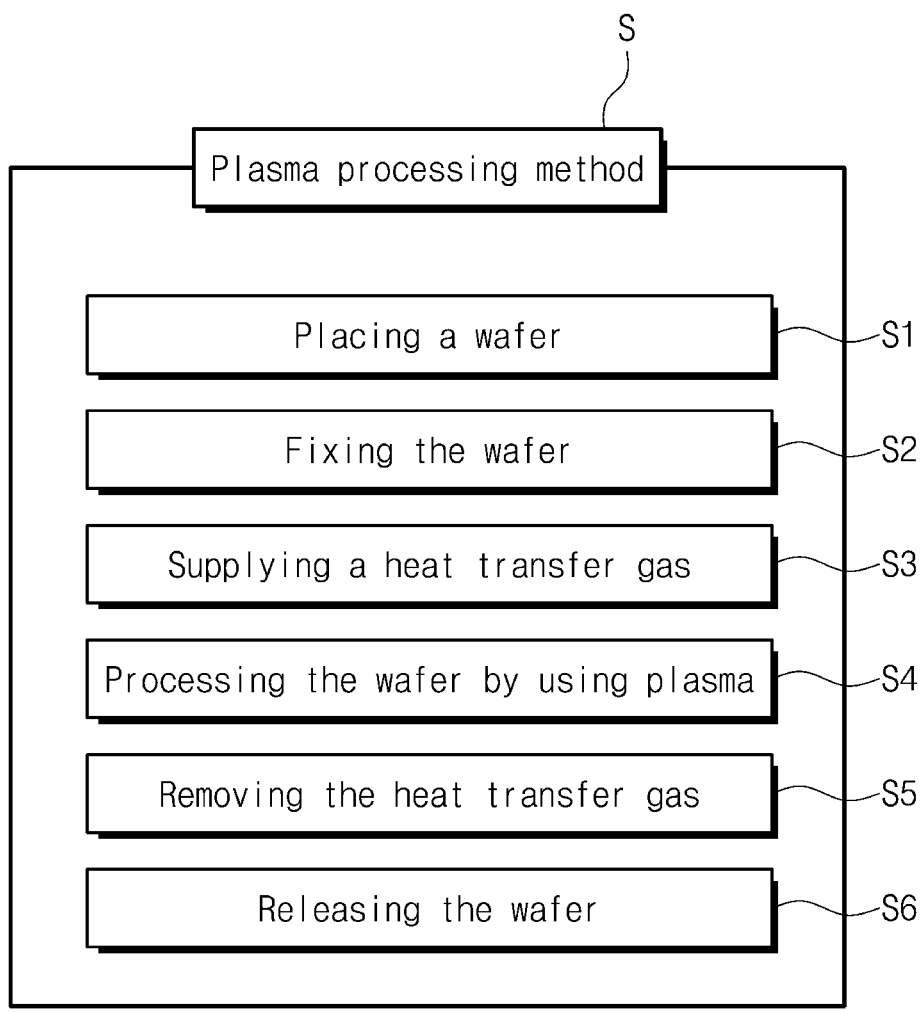
FIG. 8 is a flowchart illustrating a plasma processing method according to some embodiments of the inventive concepts.

FIG. 8 is a flowchart illustrating a plasma processing method according to some embodiments of the inventive concepts.

Referring to FIG. 8, a plasma processing method S may include placing a wafer (S1), fixing the wafer (S2), supplying a heat transfer gas (S3), processing the wafer by using plasma (S4), removing the heat transfer gas (S5), and releasing the wafer (S6). Hereinafter, the steps of the plasma processing method S will be described in detail with reference to FIGS. 9 and 10.

Figure 9:
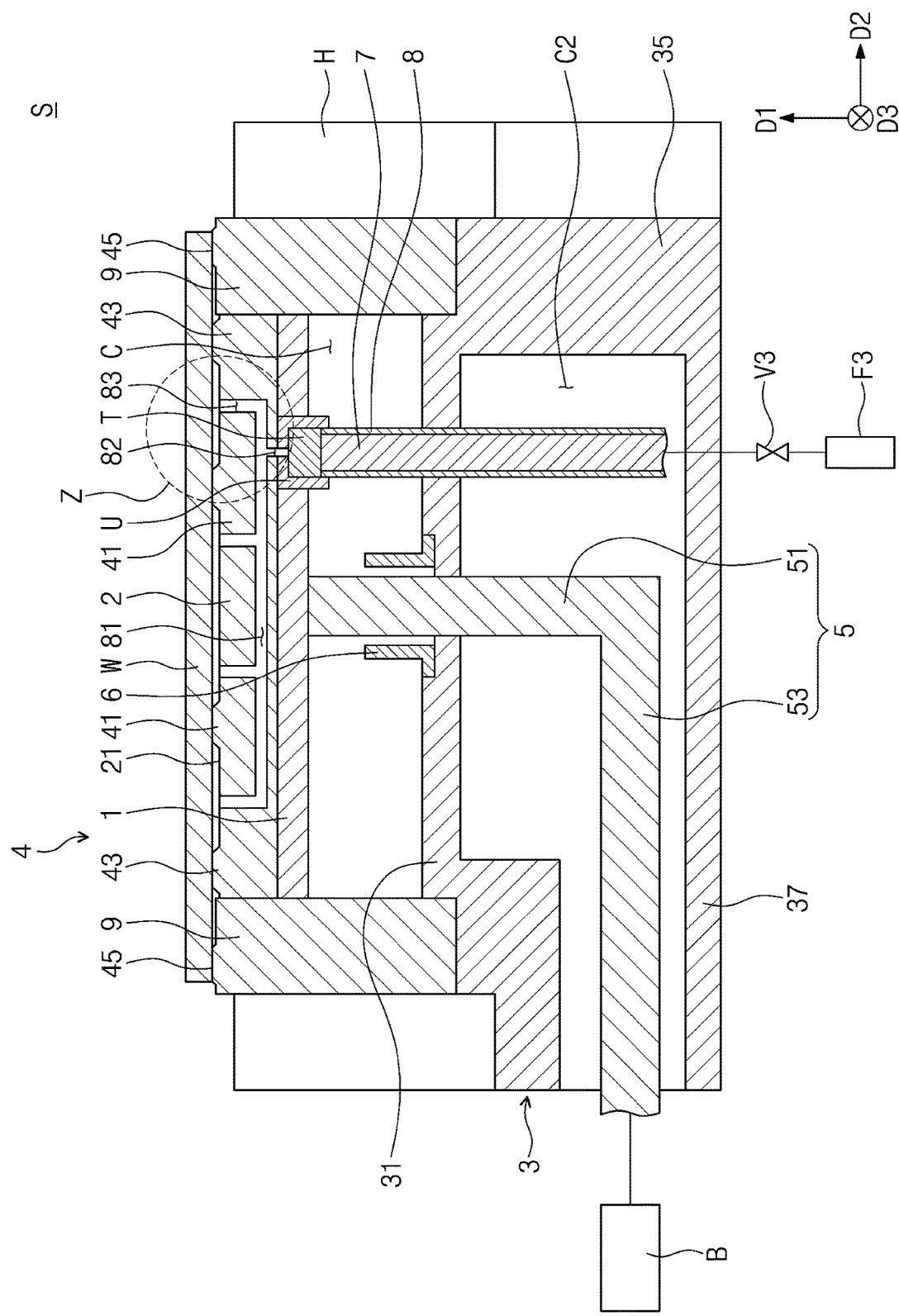
FIG. 9 is a cross-sectional view illustrating a state in which a wafer is placed on a stage of a plasma processing apparatus according to some embodiments of the inventive concepts.
Figure 10:
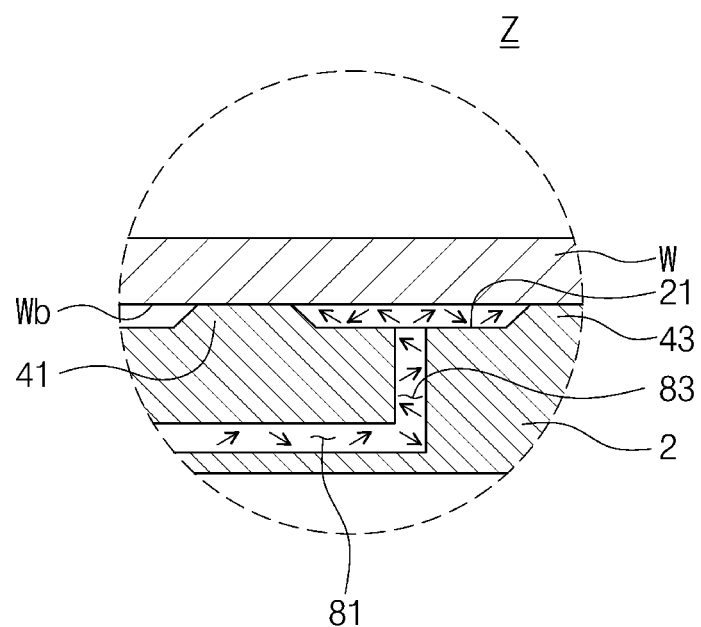
FIG. 10 is an enlarged cross-sectional view of a region 'Z' of FIG. 9.

FIG. 9 is a cross-sectional view illustrating a state in which a wafer is placed on a stage S of a plasma processing apparatus A according to some embodiments of the inventive concepts, and FIG. 10 is an enlarged cross-sectional view of a region 'Z' of FIG. 9.

Referring to FIG. 9, the placing of the wafer (S1, see FIG. 8) may include providing the wafer W into the process space I of the plasma process chamber R through the entrance port P3. Movement of the wafer W may be performed by a robot arm. The wafer W may be placed on the stage S of the plasma processing apparatus A. The wafer W may be disposed on the electrostatic chuck 2. The wafer W may be placed on the support member 4.

The fixing of the wafer (S2, see FIG. 8) may include applying a voltage to the electrostatic chuck 2. The voltage may be applied to the conductive layer of the electrostatic chuck 2. In some embodiments, a DC voltage may be applied to the conductive layer of the electrostatic chuck 2. When the voltage is applied to the conductive layer of the electrostatic chuck 2, attraction force may be generated between the electrostatic chuck 2 and the wafer W. The wafer W may be fixed at a certain/predetermined position of the electrostatic chuck 2 by the attraction force. The wafer W may be horizontally fixed on the support member 4. For example, the wafer W may be attached on the support member 4 while maintaining the wafer W horizontally.

The supplying of the heat transfer gas (S3, see FIG. 8) may include opening the gas valve V3, and supplying the heat transfer gas to the gas supply part 7 by the gas supply source F3. In some embodiments, the heat transfer gas may include a helium (He) gas. The heat transfer gas may move or flow along the gas supply part 7 in the first direction D1, as illustrated in FIGS. 3 to 5. A speed (or flow rate) of the heat transfer gas moving or flowing along the gas supply part 7 in the first direction D1 may be controlled to maintain a certain/predetermined level. For example, the pressure of the gas supply source F3, the gas valve V3 and the structure of the gas supply part 7 may be controlled to maintain the speed of the heat transfer gas within a predetermined range.

Referring to FIG. 10, the heat transfer gas may move into the space on the top surface 21 of the electrostatic chuck 2 through the gas diffusion flow path 81 and the gas distribution flow path 83. The heat transfer gas may move between the top surface 21 of the electrostatic chuck 2 and a bottom surface Wb of the wafer W. The heat transfer gas may function as a heat exchange medium between the electrostatic chuck 2 and the wafer W in the space between the top surface 21 of the electrostatic chuck 2 and the wafer W. A temperature of the wafer W may increase or decrease by the heat transfer gas. For example, the temperature of the wafer W may be adjusted by the heat transfer gas. Thus, the temperature of the wafer W may become a temperature suitable for performing a deposition process or an etching process.

The processing of the wafer by using the plasma (S4, see FIG. 8) may include applying RF power to the RF transmitting part 5 by the RF power source B. The RF power may be applied to the lower electrode 1 by the RF transmitting part 5. In some embodiments, the RF power applied to the lower electrode 1 may include source power for generating plasma. When the RF power is applied to the lower electrode 1, an electric field may be generated. As described above, the lower electrode 1 and the upper electrode part E (see FIG. 1) may form the pair of plate electrodes. In some embodiments, the electric field may be generated in the process space I (see FIG. 1). In some embodiments, the electric field may also be generated in the cavity C. The electric field generated in the cavity C may be symmetrical. The electric field generated in the cavity C may be symmetrical with respect to the first transmitting member 51. A gas in the process space I may be formed into plasma by the electric field. The deposition process or the etching process may be performed on the wafer W by the plasma. In some embodiments, the RF power applied to the lower electrode 1 may include bias power for moving the plasma. An electric field by the bias power may be generated in the process space I (see FIG. 1). The plasma in the process space I may move by the electric field. For example, the plasma may move from the process space I toward the wafer W. The deposition process or the etching process may be performed on the wafer W by the moving plasma.

The removing of the heat transfer gas (S5, see FIG. 8) may include opening the gas valve V3, and removing the heat transfer gas from the space on the top surface 21 of the electrostatic chuck 2 by the gas supply source F3. The heat transfer gas may flow from the space on the top surface 21 of the electrostatic chuck 2 to the gas supply part 7. The heat transfer gas may flow from the gas supply part 7 to the gas supply source F3 through the gas valve V3. Thus, the heat transfer gas may be removed from the space on the top surface 21 of the electrostatic chuck 2. The space on the top surface 21 of the electrostatic chuck 2 may be in a substantial vacuum. For example, the space between the electrostatic chuck 2 and the wafer W may be in a substantial vacuum.

The releasing of the wafer (S6, see FIG. 8) may include removing or interrupting the voltage applied to the electrostatic chuck 2. Thus, the attraction force formed between the electrostatic chuck 2 and the wafer W may be removed. As a result, the wafer W may be released.

After the deposition process or the etching process is finished, the wafer W may be unloaded from the plasma process chamber R. The wafer W may be moved by the robot arm. The wafer W may be moved from the process space I to the outside through the entrance port P3.

According to an embodiment of the present disclosure, a method of manufacturing a semiconductor device may include depositing a layer on a wafer and/or patterning a layer formed on a wafer using a plasma processing apparatus A described above. For example, the method may include depositing one or more layers on the wafer using the plasma processing apparatus A. A photolithography process may be applied to pattern the layers formed on the wafer. For example, a photoresist pattern may be formed on the layer formed on the wafer, and the layer may be etched in the plasma processing apparatus to form patterns using the photoresist pattern as an etching mask. The patterns may be semiconductor patterns, insulator patterns and/or conductor patterns. For example, multiple layers of patterns may be sequentially formed on the wafer. When processes forming multiple layers of patterns composing semiconductor device circuitry are completed, the wafer may be divided into individual semiconductor chips, and the individual semiconductor chips may be packaged to make semiconductor devices. The semiconductor devices may be memory devices, microprocessors and/or application specific integrated circuits.

In the plasma processing apparatus according to the inventive concepts, the withstanding voltage may be enhanced.

In the plasma processing apparatus according to the inventive concepts, the RF power having a high voltage may be applied to form and/or control plasma in the plasma processing apparatus.

In the plasma processing apparatus according to the inventive concepts, the symmetric electric field may be formed in the process space I.

In the plasma processing apparatus according to the inventive concepts, dispersion of plasma may be improved in the process space I.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A plasma processing apparatus comprising:
a chamber;

a lower and an upper electrodes vertically spaced apart from each other in the chamber;

a ground plate spaced downwardly from the lower electrode;

a RF transmitting part connected to the lower electrode and configured to supply RF power to the lower electrode, the RF transmitting part comprising a first transmitting member penetrating the ground plate and extending toward the lower electrode;

an insulating member laterally surrounding a cavity formed between the lower electrode and the ground plate; and an extension electrode horizontally overlapping and surrounding the first transmitting member in the cavity, wherein the extension electrode is coupled on the ground plate, wherein the cavity is isolated from a region under the ground plate by the ground plate, wherein the cavity is symmetrical with respect to the first transmitting member, and wherein the insulating member, the lower electrode and the ground plate airtightly enclose the cavity.

2. The plasma processing apparatus of claim 1, wherein the cavity is filled with air.

3. The plasma processing apparatus of claim 1, wherein the insulating member has a cylindrical shape having an axis of the cylindrical shape overlapping with the first transmitting member.

4. The plasma processing apparatus of claim 1, further comprising:

a support plate spaced downwardly from the ground plate, wherein a lower cavity is provided between the ground plate and the support plate.

5. The plasma processing apparatus of claim 4, wherein the RF transmitting part comprises:

a second transmitting member extending in a direction different from the extending direction of the first transmitting member, wherein the first and second transmitting members are connected to each other in the lower cavity.

6. The plasma processing apparatus of claim 1, further comprising:

an electrostatic chuck provided on the lower electrode.

7. The plasma processing apparatus of claim 6, further comprising:

a gas supply part for supplying a heat transfer gas onto a top surface of the electrostatic chuck, wherein the gas supply part penetrates the cavity.

8. The plasma processing apparatus of claim 7, wherein the gas supply part provides a gas bypass.

9. The plasma processing apparatus of claim 7, wherein the gas supply part includes a plurality of capillary tubes.

10. The plasma processing apparatus of claim 1, wherein a height of the extension electrode ranges from 40 mm to 60 mm.

11. A plasma processing apparatus comprising:

a chamber;

an upper electrode disposed at an upper portion of the chamber;

a lower electrode disposed at a lower portion of the chamber;

a RF transmitting part connected to the lower electrode and configured to supply RF power to the lower electrode;

an electrostatic chuck provided on the lower electrode;

a gas supply part configured to supply a gas to a space on a top surface of the electrostatic chuck;

a ground plate spaced downwardly from the lower electrode; and an insulating member laterally surrounding a cavity formed between the lower electrode and the ground plate, wherein the gas supply part includes a plurality of capillary tubes, and wherein the gas supply part penetrates the cavity.

12. The plasma processing apparatus of claim 11, wherein a diameter of each of the plurality of capillary tubes ranges from 50 μm to 100 μm.

13. A plasma processing apparatus comprising:

a process chamber;

an upper electrode positioned at an upper portion of the process chamber;

a lower electrode spaced apart from the upper electrode interposing a process space between the upper and lower electrodes;

a RF transmitting part connected to the lower electrode and configured to supply RF power to the lower electrode;

an electrostatic chuck provided on the lower electrode; and a gas supply part configured to supply a gas to a space on a top surface of the electrostatic chuck, wherein the gas supply part includes a gas bypass, and wherein the gas bypass comprises:

a first flow path extending vertically; and a second flow path extending laterally, wherein the first flow path is connected to the second flow path.

14. The plasma processing apparatus of claim 13, further comprising:

a gas supply part-protecting pipe surrounding the gas supply part.

15. The plasma processing apparatus of claim 14, wherein the first flow path and the second flow path are provided between an outer surface of a body of the gas supply part and the gas supply part-protecting pipe.

16. The plasma processing apparatus of claim 13, wherein an extending direction of the first flow path forms an angle of 90 degrees with the extending direction of the second flow path.

17. The plasma processing apparatus of claim 13, wherein the gas supply part includes engineering plastic.

* * * * *